United States Patent [19]

Yamada et al.

[11] Patent Number: 4,700,329
[45] Date of Patent: Oct. 13, 1987

[54] SEMICONDUCTOR MEMORY DEVICE HAVING DUMMY CELLS OF DIVIDED CHARGE TYPE

[75] Inventors: Toshio Yamada, Hirakata; Hideya Esaki, Toyonaka, both of Japan

[73] Assignee: Matsushita Electric Industrial Co., Ltd., Kadoma, Japan

[21] Appl. No.: 729,347

[22] Filed: Oct. 13, 1987

[30] Foreign Application Priority Data

May 8, 1984 [JP] Japan ................................. 59-92264

[51] Int. Cl.$^4$ ........................... G11C 7/02; G11C 7/00
[52] U.S. Cl. ..................................... 365/210; 365/189
[58] Field of Search ............... 365/149, 189, 210, 203, 365/230

[56] References Cited

U.S. PATENT DOCUMENTS 4,291,394  9/1981  Nakano et al. ...................... 365/210
4,491,858  1/1985  Kawamoto .......................... 365/149
4,498,154  2/1985  Hoffmann .......................... 365/149
4,598,387  7/1986  Chuang et al. ...................... 365/149

Primary Examiner—Terrell W. Fears
Assistant Examiner—Melissa J. Koval
Attorney, Agent, or Firm—Wenderoth, Lind & Ponack

[57] ABSTRACT

A semiconductive memory in accordance with the present invention enables the correct setting of the reference electrical potential of a DRAM which is not affected by manufacturing processes by the use of a construction such that, into two dummy cell capacitors having the same capacitance as that of memory cell capacitors for holding information, signals of "1" and "0" or "0" and "1" are respectively written from the first and the second bit lines; thereafter, two dummy cell capacitors are electrically decoupled from the two bit lines and, then, by coupling two dummy cell capacitors, reference charges are obtained, which are then read out.

2 Claims, 14 Drawing Figures

SEMICONDUCTOR MEMORY DEVICE HAVING DUMMY CELLS OF DIVIDED CHARGE TYPE

BACKGROUND OF THE INVENTION

This invention relates to a semiconductor memory device and more particularly, to a dynamic random access memory (DRAM) device in which a constant reference electrical potential can be obtained regardless of the manufacturing processes of the device.

Since the advent of the 16 kbit DRAM, in a transistor cell DRAM, dummy cells each having a capacity one half that of the memory cell were used for setting the reference electrical potential. In this instance, it is so designed that the area of the capacitor in the dummy cell be one half that in the memory cell, as the process has been accomplished. Because the memory cell and the dummy cell differ in configuration, however, the effect of variations intrinsic to the manufacturing processes makes it difficult to always have the capacitance of the dummy cell be exactly one half that of the memory cell. As a result, the reference electrical potential obtained by reading the charge in the dummy cell has some variation. Consequently, the range of the operation margin of the sense circuit is narrowed, inviting a reduction in the yield of the whole semiconductor memory device in the final analysis.

The prior art device has such a problem. Thus, it is a hard way to try to attain a higher degree of integration.

SUMMARY OF THE INVENTION

Accordingly, it is a principal object of the present invention to provide a semiconductor memory device which permits the reference potentials to be correctly set without sustaining any influence from the manufacturing processes.

This invention provides a semiconductor memory device which permits the setting of the reference potential to be made in such a way that after writing the signals "1" and "0" or "0" and "1" from first and second bit lines into first and second dummy cell capacitors for holding information, each of which has the same capacitance as that of the memory cell capacitor, the first and the second dummy cell capacitors are electrically decoupled from the first and the second bit lines and, then, by electrically connecting the first and second dummy cell capacitors, the reference charges are obtained and then are read out.

The following advantages, among others, are obtained from this invention:

(1) Since the dummy cell and the memory cell have the same shape and structure, the ratio of their storage capacitances is always 1:1, without being affected by the effect of variations in the manufacturing processes. Therefore, the reference electrical potential set by the dummy cell is always correct.

(2) Even if the precharge voltage level is set at an arbitrary value, a correct reference electrical potential can be obtained. For this reason, the precharge voltage may be freely set at large values, permitting the capacity of the bit line to be small and the read voltage to be large, as a result.

While the novel features of the invention are set forth with particularity in the appended claims, the invention, both as to organization and content, will be better understood and appreciated, along with other objects and features thereof, from the following detailed description taken in conjunction with the drawings.

DESCRIPTION OF THE PREFERRED EMBODIMENTS

Figure 1:
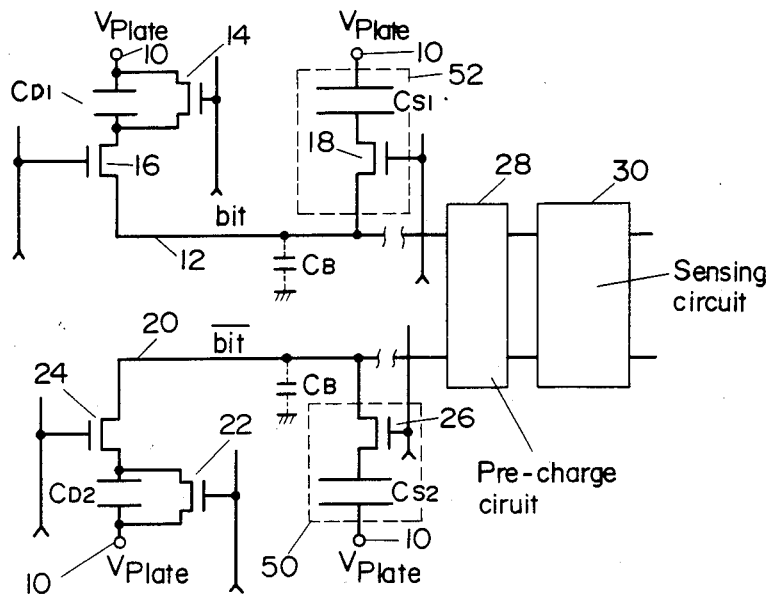
FIG. 1 is a circuit diagram of the principal part of a conventional DRAM used as a conventional semiconductor memory device.

Before describing this invention, for a better understanding of this invention, a semiconductor memory which was in use before this invention was made, or more particularly, a DRAM, is described with reference to FIGS. 1 through 4(c). FIG. 1 shows the circuits of the principal part of a DRAM, in which between terminals 10 on which the fixed voltage $V_{plate}$ is applied and bit line 12, there are inserted, respectively, a series-connected circuit of an MOS transistor 16 and a dummy cell capacitor $C_{D1}$ connected in parallel with an MOS transistor 14, and a series-connected circuit of a memory cell $C_{S1}$ and an MOS transistor 18 which are included in a memory cell 52. Between terminals 10 and $\overline{bit}$ line 20, there are inserted, respectively, a series-connected circuit of an MOS transistor 24 and dummy cell capacity $C_{D2}$ connected in parallel with an MOS transistor 22, and a series-connected circuit of memory cell capacity $C_{S2}$ and an MOS transistor 26 which are included in a memory cell 50.

It should be understood that a large number of memory cells, which are not shown in FIG. 1, are, of course, connected to bit line 12 and $\overline{bit}$ line 20. The two types of bit lines 12 and 20 are connected to a sense circuit 30 through a precharge circuit 28. $C_B$ represents a stray capacitance between bit line 12 or $\overline{bit}$ line 20 and a substrate. In memory cell capacity $C_{S1}$, a single charge of "1" or "0" is stored at the time of rewriting. Under this condition, bit line 12 and $\overline{bit}$ line 20 are precharged to a specified electrical potential by the circuit 28. During this period, by rendering MOS transistors 16 and 24 non-conductive, while rendering MOS transistors 14 and 22 conductive, the signal charge of dummy cell capacitors $C_{D1}$ and $C_{D2}$ is set to "0". The dummy cell capacitor $C_D$ is given by $C_D(C_{D1}=C_{D2})=\frac{1}{2}C_S(C_{S1}=C_{S2})$. After the precharge has been accomplished, transistors 14 and 22 are rendered non-conductive, while transistors 18 and 24 are rendered conductive. Then, the signal charges are read out of $C_{S1}$ and $C_{D2}$ to the bit line 12 and the $\overline{\text{bit}}$ line 20. As a result, between $C_{S1}$ and bit line 12, and between $C_{D2}$ and $\overline{\text{bit}}$ line 20, a redistribution of charges is made, giving rise to a minute electric potential difference between bit line 12 and $\overline{\text{bit}}$ line 20. This potential difference is amplified by the sense circuit 30, thereby accomplishing the read out operation. Assuming that electrical potential which appears on the bit line 12 when the signal charge of "1" is stored in the memory cell capacitor $C_{S1}$ is $V_{R1}$, that electrical potential which appears on bit line 12 when the signal charge of "0" is stored in $C_{S1}$ is $V_{R0}$, and that electrical potential which develops on the $\overline{\text{bit}}$ line 20 when the charge stored in the dummy cell capacitor $C_{D1}$ is read out is $V_{Ref}$, then a relationship $V_{R0} < V_{Ref} < V_{R1}$ is necessary. In the conventional device, the following relationships exist:

$$V_{R1} = \frac{1}{C_S + C_B}(C_S V_{DD} + C_B V_{PR}) \quad (1)$$

$$V_{R0} = \frac{1}{C_S + C_B} C_B V_{PR} \quad (2)$$

$$V_{Ref} = \frac{1}{C_S/2 + C_B}\left(\frac{C_S}{2} \cdot V_{DD} + C_B V_{PR}\right) \quad (3)$$

$$\frac{V_{R1} + V_{R0}}{2} = \frac{1}{C_S + C_B}\left(\frac{C_S}{2} V_{DD} + C_B V_{PR}\right) \quad (4)$$

Figure 2:
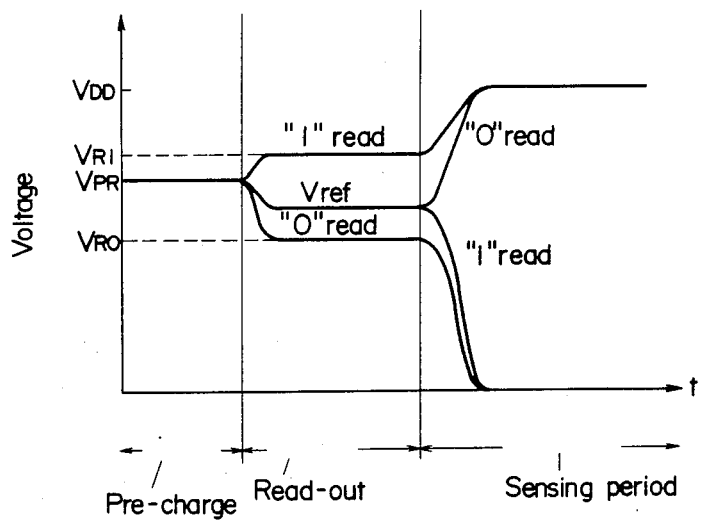
FIG. 2 is a diagram for explanation of the operation of the conventional DRAM.

Since $$V_{Ref} \neq \frac{V_{R1} + V_{R0}}{2},$$

it is apparent that the potential $V_{Ref}$ is not exactly intermediary between $V_{R1}$ and $V_{R0}$ (see, FIG. 2). (Provided that in this instance, the cell plate potential is set at $V_{plate} = V_{DD}$.) This is because while a redistribution of charges is made between capacitor $C_S$ and bit line capacity $C_B$ for memory cell capacitor $C_{S1}$, a redistribution of charges is made between the capacitor $C_D(=\frac{1}{2}C_S)$ and $\overline{\text{bit}}$ line capacitor $C_B$ for dummy cell capacitor $C_{D2}$. (The calculations hereabove described have been made on the assumption that the rewrite voltage is $V_{DD}$, and that the precharge voltage is $V_{PR}$.)

Figure 3A:
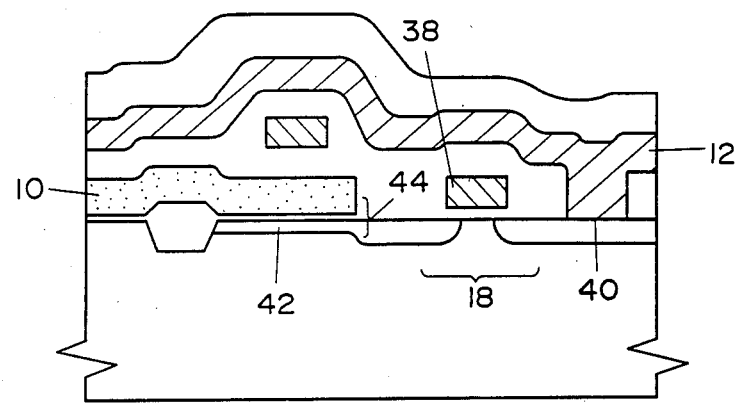
FIG. 3(a) is a sectional view of the memory cell of the conventional DRAM.
Figure 3B:
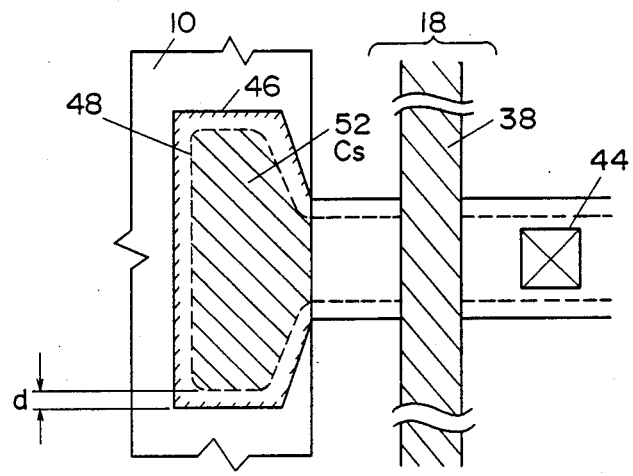
FIGS. 3(b) and (c) are plan views of the memory cell and the dummy cell of the conventional DRAM.
Figure 3C:
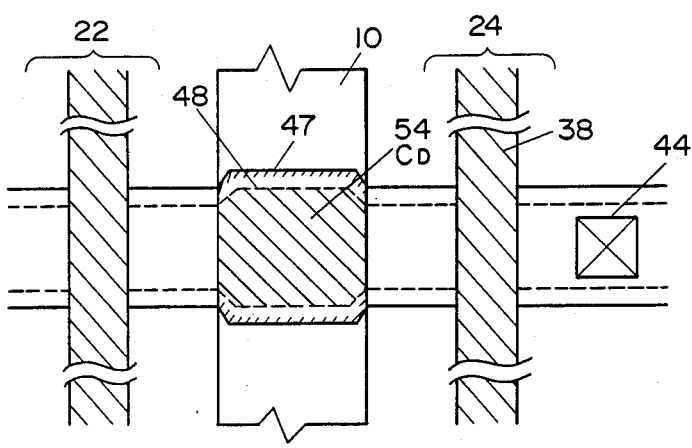
Figure 4A:
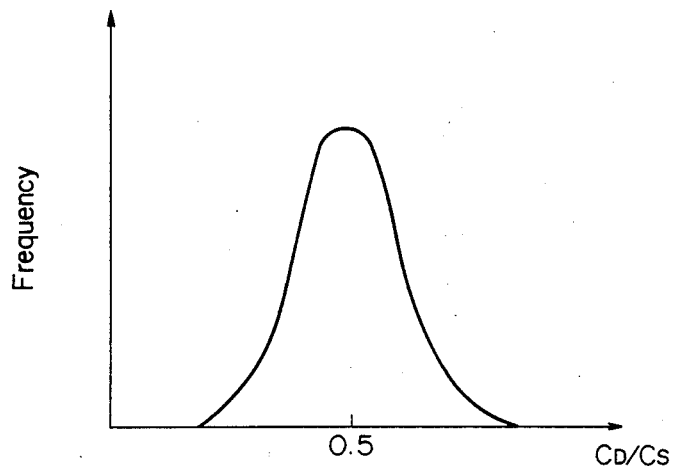
FIG. 4(a) is a graph showing the distribution of the ratio of the capacity of the dummy cell capacitor to the memory cell capacitor.

As hereabove described, in the conventional device, in principle, reference voltage $V_{Ref}$ is not exactly intermediary between the "1" read voltage $V_{R1}$ and the "0" read voltage $V_{R0}$. The reference voltage $V_{Ref}$ is considered to vary further due to the dependecy of the ratio of the capacity of the memory cell capacitor $C_S$ to the dummy cell capacitor $C_D$ on the manufacturing processes for integrally making the semiconductor memories including these capacitors into the device; as a result, the operation margin range of the sense circuit is narrowed down. This is explained hereunder:

FIG. 3(a) illustrates a structure of a section of a DRAM. The bit line 12 is connected to memory cell capacitor 44 through contact part 40 and MOS transistor 18. Here the memory cell capacitor 44 is formed between memory cell electrode 10 linked to a fixed potential and a diffusion layer 42. FIG. 3(b) illustrates a plan view structure of the memory cell part of the DRAM. The memory cell capacitor as defined by the mask design is represented by region 46, but after being processed, the actual configuration of the memory cell capacity becomes the area indicated by region 52, this part forming the memory cell capacitor $C_S$. FIG. 3(c) illustrates a plan view of the DRAM dummy cell structure. The dummy cell capacitor as defined by the mask design is represented by region 47, but after being processed, the actual configuration of the dummy cell capacitor becomes the area indicated by region 54, this part forming dummy cell capacitor $C_D$. In formulating the design, configurations 46 and 47 of the capacitors as defined by the mask designs are so determined as to make the ratio of the area of memory cell capacitor 52 after processing to the area of dummy cell capacitor 54 after processing to be 2:1; the amount d of variation in the configuration after processing has a dispersion peculiar to the process. Thus, even in the same process flow, the amount d of the variation in the configuration has dispersions from lot to lot and from chip to chip. As a result, the ratio $C_D/C_S$ of the dummy cell capacitance to the memory cell capacitance shows a definite distribution as shown in FIG. 4(a), Now assuming $C_D/C_S = X$, the formula (3) gives, $$V_{Ref} = \frac{1}{C_S \cdot X + C_B}(C_S \cdot X \cdot V_{DD} + C_B V_{PR}) \quad (5)$$

Figure 4B:
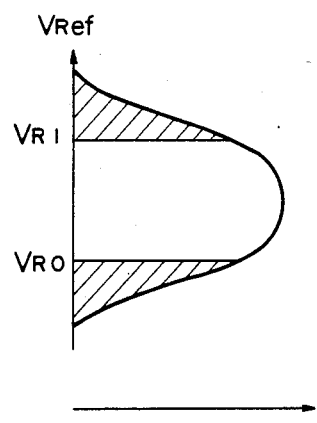
FIGS. 4(b) and (c) are graphs showing the distribution of the reference electrical potential and the operation ranges.
Figure 4C:
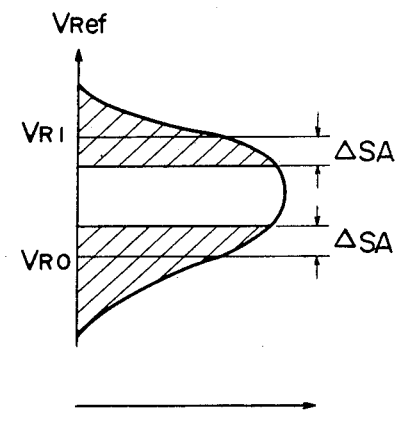

Thus $V_{Ref}$ has a distribution as shown in FIG. 4(b). The minute electric potential difference between the bit line and the $\overline{\text{bit}}$ line which results from the process of reading the charges out of the memory cell and the dummy cell into the bit line and the $\overline{\text{bit}}$ line is amplified by the sense circuit. Even if a sense circuit is capable of an exact amplification of whatever minute potential difference is utilized, a read error will occur at the regions indicated by hatching in FIG. 4(b). These are regions where the electrical potential $V_{Ref}$ set by the dummy cell is larger than the electrical potential $V_{R1}$ produced on the bit line when the signal "1" is read out of the memory cell or regions where $V_{Ref}$ is smaller than the potential $V_{R0}$ produced on the bit line at the time of a "0" read. In an actual sense circuit, the sensitivity is not infinite. Thus, unless a finite potential difference $\Delta S_A$ is produced between the bit line and the $\overline{\text{bit}}$ line, a correct amplification can not be made. Accordingly, in actual circuits, the error regions (the parts indicated by hatching in FIG. 4(c)) increase, as shown in FIG. 4 (c).

Figure 5:
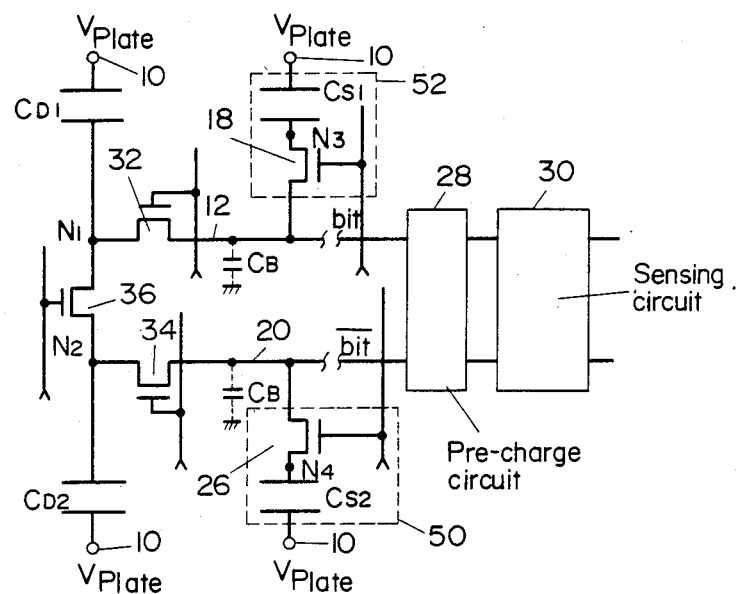
FIG. 5 is a diagram of the circuit of the principal part of the semiconductor memory device of the first embodiment according to the present invention.

Now, a DRAM as a first embodiment of this invention is described in conjunction with FIG. 5. This embodiment has many parts in common with the conventional device of FIG. 1. Therefore, a detailed explanation of them is omitted, and the same numerals are assigned to the identical parts.

The construction of this device includes, as shown in FIG. 5, a dummy cell capacitor $C_{D1}$ connected to bit line 12 through an MOS transistor 32, another dummy cell capacitor $C_{D2}$ connected to $\overline{\text{bit}}$ line 20 through an MOS transistor 34 and another MOS transistor 36 inserted between node N, between MOS transistor 32 and $C_{D1}$ and node $N_2$, between MOS transistor 34 and $C_{D2}$, with information cell capacitor $C_{S1}$ for holding memory connected to bit line 12 through MOS transistor 18, and memory cell capacitor $C_{S2}$ to $\overline{\text{bit}}$ line 20 through MOS transistor 26. Where $$C_D(C_{D1}=C_{D2})=C_S(C_{S1}=C_{S2})$$

The operation of the first embodiment is described. Let's consider the operations of reading the signal of "1" out of memory cell capacitor $C_{S1}$ and, then, rewriting it thereinto: At this time, transistors 32, 34 and 18 are rendered conductive, while the other transistors are rendered non-conductive.

Figure 6:
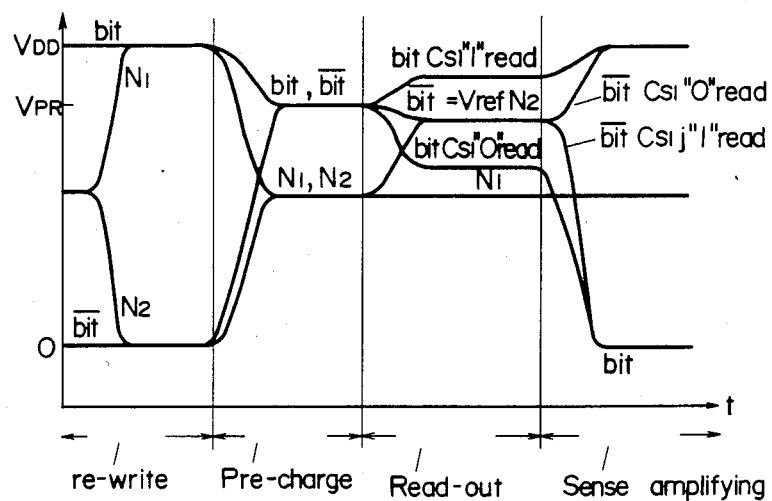
FIG. 6 is a graph for explanation of the operation of the semiconductor memory device of the first embodiment.

Whereby, just as the "1" is rewritten into $C_{S1}$, "1" is written into dummy cell capacitor $C_{D1}$, and a "0" into dummy cell capacitor $C_{D2}$. (see, to FIG. 6)

Then, with only transistor 36 kept conductive, and the other transistors kept non-conductive, the precharge is conducted, whereby a redistribution of charges is made between dummy cell capacitors $C_{D1}$ and $C_{D2}$; thus, both $C_{D1}$ and $C_{D2}$ acquiring exactly ½ signal charge amounts, respectively, of the signal charge amount of "1" and the signal charge amount of "0". On the other hand, during this period, both bit line 12 and $\overline{\text{bit}}$ line 20 are precharged to $V_{PR}$.

Next, let's consider the operations for reading the signal out of the memory cell capacitor $C_{S1}$ coupled to the bit line. While transistors 18 and 34 are rendered conductive, other transistors are rendered non-conductive. At this time, a voltage difference develops between bit line 12 and $\overline{\text{bit}}$ line 20, which the sense circuit amplifies. The potential of bit line 20 at the read time is given by the following formula, assuming $C_D=C_S$:

$$V_{\overline{bit}} = V_{Ref} = \frac{1}{C_S + C_B}\left( C_B V_{PR} + \frac{C_S}{2} V_{DD} \right) \quad (6)$$

When the signal charge of "1" is stored in the memory cell capacitor, the potential on the bit line 12 becomes, $$V_{R1} = \frac{1}{C_S + C_B} \{C_B V_{PR} + C_S V_{DD}\} \quad (7)$$

When the signal charge of "0" is stored in the memory cell capacitor, the potential on bit line 12 becomes, $$V_{R0} = \frac{1}{C_S + C_B} C_B V_{PR} \quad (8)$$

From these formulae:

$$\frac{V_{R1} + V_{R0}}{2} = \frac{1}{C_S + C_B}\left( C_B V_{PR} + \frac{C_S}{2} V_{DD} \right) = V_{Ref} \quad (9)$$

Thus the reference potential $V_{Ref}$ set on $\overline{\text{bit}}$ line 20 is understood to be exactly equal to the intermediary potential $$\left( = \frac{V_{R1} + V_{R0}}{2} \right)$$

between the "1" read potential $V_{R1}$ and "0" read potential $V_{R0}$.

The above-description is taken on the assumption that the rewrite level is $V_{DD}$, the precharge level $V_{PR}$, and that the voltage applied on the gate of a transistor is larger than the sum of the power source voltage and the thresholed value $(=V_{DD}+V_{th})$. The exact reference electric potential $V_{Ref}$ will be obtained by adopting the construction of this embodiment, even if the aforementioned conditions are not met.

Figure 7:
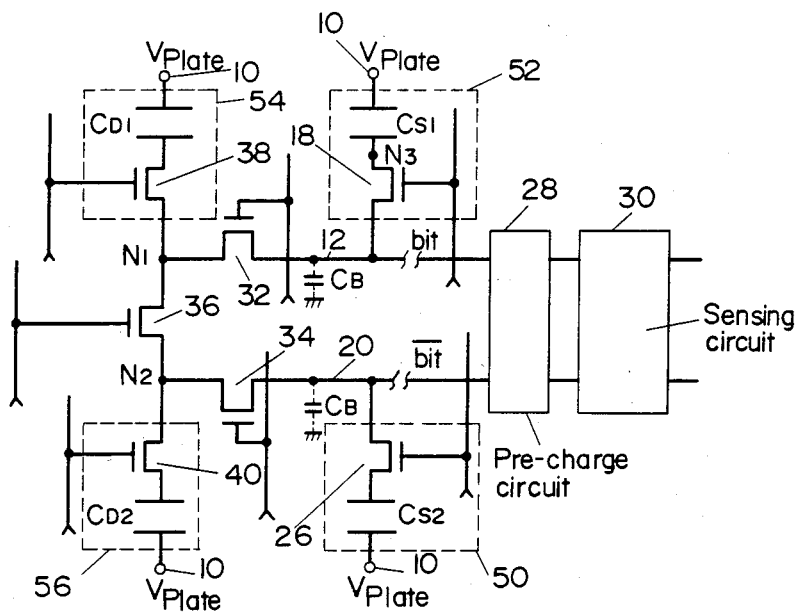
FIG. 7 is a diagram of the circuit of the principal part of the semiconductor memory device of the second embodiment according to the present invention.

In the following, a second embodiment is described. As shown in FIG. 7, memory cells 52 and 50 of a construction such that electrodes on one side of the memory cell capacitors are connected with fixed potentials 10 and read transistors are associated with electrodes on the other side, respectively, are linked to bit line 12 and $\overline{\text{bit}}$ line 20. Dummy cells 54 and 56 which have exactly the same configuration, same capacity, and the same transistor as those of the memory cells 50 and 52 are linked to bit line 12 and $\overline{\text{bit}}$ line 20 through MOS transistors 32 and 34, respectively. The node $N_1$ between dummy cell 54 and MOS transistor 32 and the node $N_2$ between dummy cell 56 and MOS transistors 34 are connected with MOS transistor 36 therebetween.

In the following, the operation of the second embodiment is described: At the time of rewriting, with the MOS transistors 32 and 34 and the MOS transistors 38 and 40 in dummy cells 54 and 56 rendered conductive, while the other MOS transistors are driven non-conductive, signals of "0" and "1" or "1" and "0" are written into the dummy cell capacitors $C_{D1}$ and $C_{D2}$ in dummy cells 54 and 56; thereafter, by rendering MOS transistors 32 and 34 non-conductive and MOS transistor 36 conductive, capacitors $C_{D1}$ and $C_{D2}$ in dummy cells 54 and 56 are electrically decoupled from bit line 12 and $\overline{\text{bit}}$ line 20. Then by way of rendering MOS transistor 36 conductive, the dummy cell capacitors $C_{D1}$ and $C_{D2}$ are coupled in series, thereby yielding reference charges in dummy cell capacitors $C_{D1}$ and $C_{D2}$. During this period, bit line 12 and $\overline{\text{bit}}$ line 20 are precharged to a specified potential $V_{PR}$ by means of precharge circuit 28. Then, with transistors 38 and 40 in the dummy cells rendered non-conductive, while MOS transistors 32 and 34 are rendered conductive, nodes $N_1$ and $N_2$ are also precharged to the specified potential $V_{PR}$. When the data in the capacitor $C_{S1}$ of memory cell 52 is to be read, transistor 18 of memory cell 52 and MOS transistor 40 of dummy cell 56 are rendered conductive, the signal charge in the memory cell capacitor $C_{S1}$ is read out to bit line 12, while the reference charge in dummy cell capacitor $C_{D2}$ is read out to $\overline{\text{bit}}$ line 20. Then, a minute potential difference arises between bit line 12 and $\overline{\text{bit}}$ line 20, which is then amplified by sense circuit 30.

In the first embodiment, referring to FIG. 5, if there is a large difference between the capacity which exists between the node $N_1$ and the semiconductor substrate and the capacity between the node $N_3$ in memory cell 52 and the semiconductor substrate, it will appear as the error in the reference potential, but in the second embodiment, the dummy cell and the memory cell are exactly identical and, therefore, this disadvantage is not rid of.

Figure 8A:
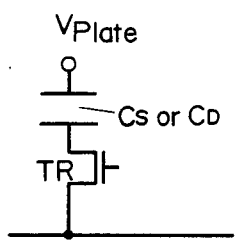
FIG. 8(a) is a diagram of the cell connected through a transistor.
Figure 8B:
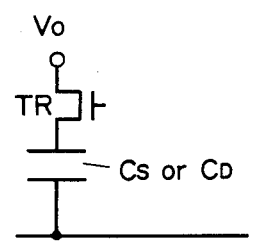
FIG. 8(b) is a diagram of the cell not intermediated by any transistor.

In both the first and the second embodiments, as shown in FIG. 8(a), the capacitor is linked to the bit line through a transistor TR in both the dummy cell and memory cell, but similar effects of these embodiments may be achieved by making use of a cell construction in which, as shown in FIG. 8(b), the capacity is directly linked to the bit line at one end, while the other end is connected to a fixed potential through a transistor TR.

Figure 9:
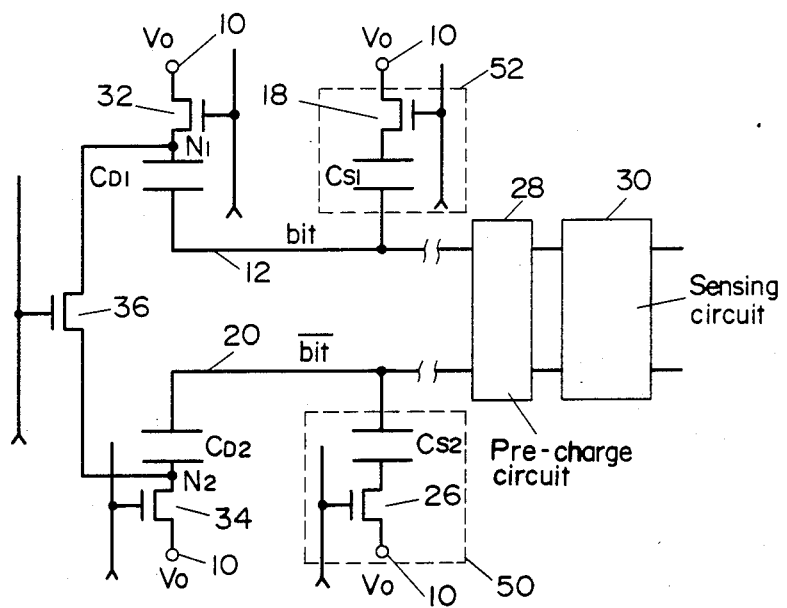
FIG. 9 is a circuit diagram of the first embodiment where the dummy cell capacitors and the memory cell capacitors are directly connected to the bit lines.

Particularly, when the dummy cell capacitor and the memory cell capacitor are directly linked to the bit line at one end, while at the other end, they are joined to fixed potentials through MOS transistors in the construction of the first embodiment, the circuit shown in FIG. 9 is composed. The operation and the operation principle of such a circuit are the same as those mentioned in connection with the first embodiment. Their explanations are omitted.

As hereabove described, according to this invention, it is possible to set exact reference electric potentials. The dummy cell and memory cell, having the same capacity and the same construction, show no dispersion depending on the manufacturing process. Besides, the precharge voltage may be freely set to values larger than $\frac{1}{2}V_{DD}$, whereby it is possible to decrease the capacity of the bit line and consequently, to increase the read voltage. Furthermore, during the sense amplifying period, no unbalance in capacity between the bit line and the $\overline{bit}$ line will take place because of $C_S=C_D$ and for this reason, a large operation margin for the sense circuit can be taken.

While specific embodiments of this invention have been illustrated and described herein, it is realized that modifications and changes will occur to those skilled in the art. It is, therefore, to be understood that the appended claims are intended to cover all modifications and changes as fall within the true spirit and scope of the invention.

What is claimed is:

1. A semiconductor memory device comprising:
   first and second bit lines;
   at least first and second memory cells respectively connected to said first and second bit lines and to a voltage source;
   first and second dummy cells and first and second coupling means, said first dummy cell being connected to said first bit line via said first coupling means and said second dummy cell being connected to said second bit line via said second coupling means, an interconnection point between said first dummy cell and said first coupling means forming a first node and an interconnection point between said second dummy cell and said second coupling dummy means forming a second node;
   a third coupling means connected between said first and second nodes;
   a precharged circuit connected to said first and second bit lines;
   a sense circuit connected to said first and second bit lines for sensing the voltage therebetween;
   said first dummy cell comprises a first dummy capacitor connected in series with a fourth coupling means such that said first dummy capacitor is connected to said voltage source and said fourth coupling means is connected to said first bit line;
   said second dummy cell comprises a second dummy capacitor connected in series with a fifth coupling means such that said second dummy capacitor is connected to said voltage source and said fifth coupling means is connected to said second bit line;
   said first memory cell comprising a first memory capacitor connected in series with a sixth coupling means such that said first memory capacitor is connected to said voltage source and said sixth coupling means is connected to said first bit line;
   said second memory cell comprising a second memory capacitor connected in series with a seventh coupling means such that said second memory capacitor is connected to said voltage source and said seventh coupling means is connected to said second bit line;
   wherein all of said capacitors have substantially identical capacitances;
   and wherein said first and second coupling means respectively selectively couple and decouple said first and second nodes to said first and second bit lines and wherein said third coupling means selectively couples and decouples said first node to said second node and said fourth and fifth coupling means respectively selectively couple said first and second dummy capacitors to said first and second nodes and said sixth and seventh coupling means respectively selectively connect said first and second memory capacitors to said first and second bit lines in accordance with the following:
   during rewriting, said first and second and fourth and fifth coupling means are rendered conductive while said third and sixth and seventh conducting means are rendered nonconductive such that information is written into said first and second dummy capacitors;
   thereafter, said first and second coupling means are rendered nonconductive and said third coupling means rendered conductive such that said first and second dummy capacitors are electrically decoupled from said first and second bit lines;
   said third coupling means is rendered conductive such that said first and second dummy capacitors are electrically coupled in series, thereby causing reference charges in said first and second dummy capacitors;
   simultaneously, said first and second bit lines are precharged to a predetermined potential by said precharged circuit and then, said fourth and fifth coupling means are rendered nonconductive and said first and second coupling means rendered conductive so that first and second nodes are also precharged to said predetermined potential;
   when information stored in said first memory capacitor is to be read, said sixth and fifth coupling means are rendered conductive and charge stored in said first memory capacitor is read out to said first bit line while the reference charge stored in said second dummy capacitor is read out to said second bit line, thereby causing a potential difference between said first and second bit lines which is sensed by said sense circuit;
   and when information in said second memory capacitor is to be read, said seventh and fourth coupling means are rendered conductive and charge stored in said second memory capacitor is read out to said second bit line while the reference charge in said second dummy capacitor is read out to said first bit line, thereby causing a potential difference between said first and second bit lines which is sensed by said sense circuit.

2. A device in accordance with claim 2, wherein said first through seventh coupling means each comprise MOS transistors.

* * * * *